(12) United States Patent
Miller

(10) Patent No.: US 7,062,742 B2
(45) Date of Patent: Jun. 13, 2006

(54) ROUTING STRUCTURE FOR TRANSCEIVER CORE

(75) Inventor: Leah M. Miller, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 146 days.

(21) Appl. No.: 10/420,216

(22) Filed: Apr. 22, 2003

(65) Prior Publication Data
US 2004/0216071 A1    Oct. 28, 2004

(51) Int. Cl.
G06F 17/50 (2006.01)

(52) U.S. Cl. .................. 716/12; 716/8; 716/9; 716/10; 716/11; 716/13; 716/14; 716/15; 257/700

(58) Field of Classification Search ............ 716/1, 716/8–15; 326/39–41; 257/700; 710/21, 710/305, 105–106; 370/503
See application file for complete search history.

(56) References Cited

U.S. PATENT DOCUMENTS

| | | | |
|---|---|---|---|
| 5,227,739 A | 7/1993 | Mandai et al. | |
| 5,278,524 A | 1/1994 | Mullen | |
| 5,300,899 A | 4/1994 | Suski | |
| 5,675,298 A | 10/1997 | Bhagwan et al. | |
| 5,686,764 A * | 11/1997 | Fulcher | 257/778 |
| 6,061,747 A * | 5/2000 | Ducaroir et al. | 710/21 |
| 6,070,211 A * | 5/2000 | Neal et al. | 710/106 |
| 6,611,537 B1* | 8/2003 | Edens et al. | 370/503 |
| 6,617,877 B1* | 9/2003 | Cory et al. | 326/41 |
| 6,617,943 B1 | 9/2003 | Fazelpour | |
| 6,710,424 B1* | 3/2004 | Schmidt | 257/531 |
| 6,744,130 B1* | 6/2004 | Miller et al. | 257/700 |
| 2003/0065859 A1* | 4/2003 | Dao et al. | 710/305 |

* cited by examiner

Primary Examiner—Vuthe Siek
(74) Attorney, Agent, or Firm—Luedeka, Neely & Graham, P.C.

(57) ABSTRACT

A routing structure for a transceiver core, the routing structure including a transmitter block design and a receiver block design. The transmitter block design includes two dedicated transmitter power contacts, two common ground contacts, and two transmitter signal contacts in a transmitter differential pair. The two transmitter signal contacts are both adjacent each of the two dedicated transmitter power contacts and each of the two common ground contacts. The receiver block design includes two dedicated receiver power contacts, two common ground contacts, and two receiver signal contacts in a receiver differential pair. The two receiver signal contacts are both adjacent each of the two dedicated receiver power contacts and each of the two common ground contacts.

20 Claims, 3 Drawing Sheets

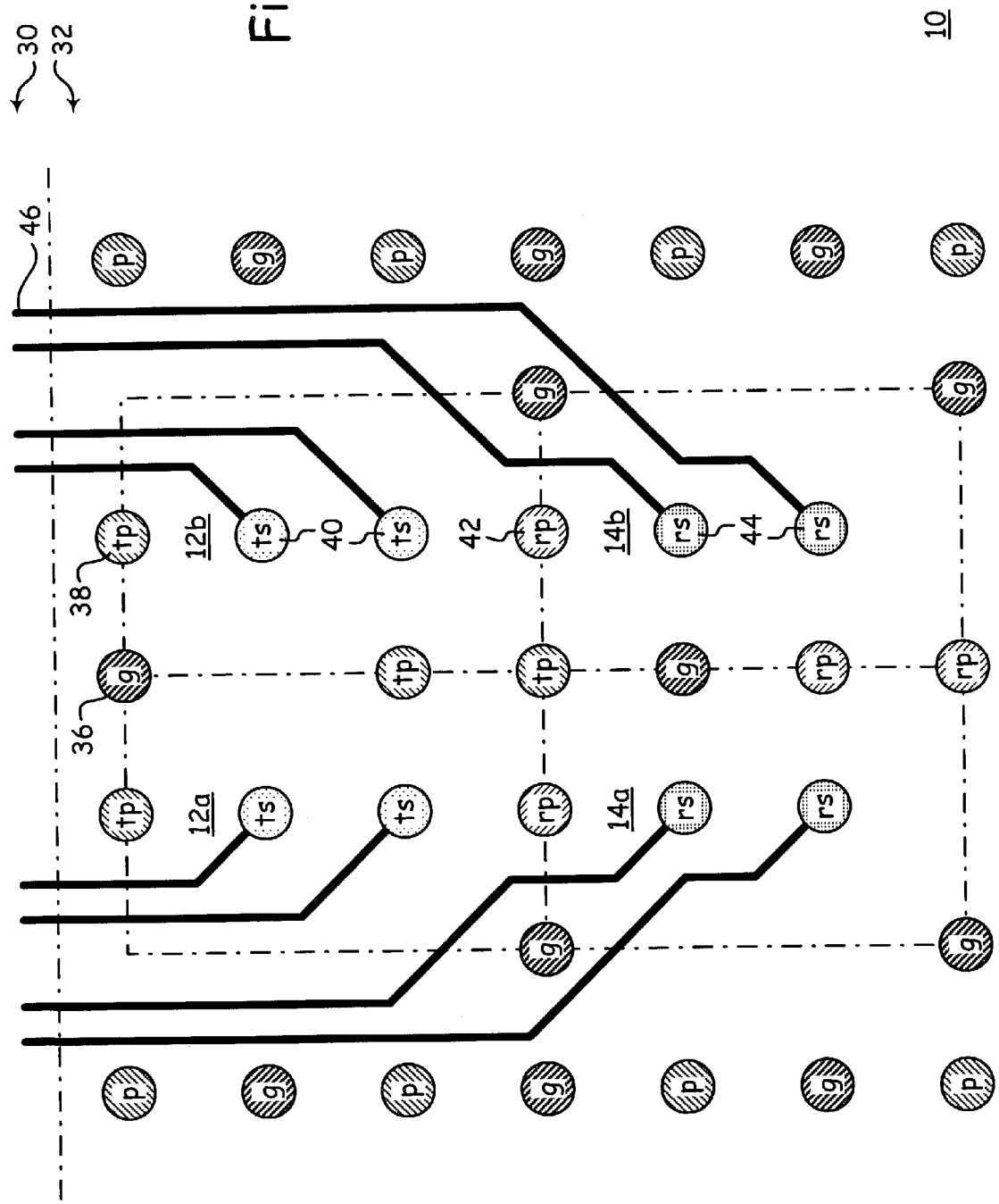

ROUTING STRUCTURE FOR TRANSCEIVER CORE

FIELD

This invention relates to the field of integrated circuit fabrication. More particularly, this invention relates to routing structures for integrated circuit packages.

BACKGROUND

Some types of integrated circuits are completely custom designed, where each of the electrical devices in the integrated circuit is specifically selected for the custom design, and the integrated circuit is laid out in a customize manner. Such integrated circuits tend to have a relatively large amount of overhead associated with them. For example, there is a large amount of design work involved in producing such a customized integrated circuit. Further, customized mask sets and tooling are required to produce the integrated circuits. When it is expected that a very large number of the integrated circuits will be sold, then it can be cost effective to invest in the overhead associated with the customized integrated circuit, as the overhead can be paid off over a large number of the integrated circuits.

However, there are other applications where such a large number of sales of the integrated circuit is not expected. In these applications, it tends to be cost prohibitive to design the integrated circuit from scratch, so to speak, and to invest in completely customized mask sets and tooling, because there will not be enough of the integrated circuits fabricated to justify such a large investment.

For these smaller-number applications, a different type of integrated circuit is commonly used, called an application specific integrated circuit, or ASIC. ASICs are designed using standardized design elements, or modules, which are combined in a desired configuration to support the intended application. In other words, the design of the integrated circuit is application-specific, as the name implies. ASICs tend to be much cheaper to design and produce than custom integrated circuits, because the standardized design elements have already been designed. Further, mask designs already exist for the design elements. Thus, there is a tremendous head-start on the design process, and ASICs therefore tend to be much less expensive to fabricate than completely customized integrated circuits.

Unfortunately, because the standardized design elements of an ASIC can be combined in a variety of ways, the cost savings associated with standardization have typically not been extended to the packaging used for the ASICs, or the printed circuit boards to which they are ultimately mounted. For example, because different ASICs—even those using similar standardized modules—tend to be laid out with the standardized modules in different configurations, the package substrate and printed circuit board typically require a different configuration for each such design. Thus, all the costs of a completely customized package design tend to be incurred, even when using standardized modules in an ASIC design.

What is needed, therefore, are package substrate and printed circuit board designs with standardized elements for use with an ASIC, which designs can help reduce the costs associated with designing packages and circuit boards for different ASICs.

SUMMARY

The above and other needs are met by a routing structure for a transceiver core, the routing structure including a transmitter block design and a receiver block design. The transmitter block design includes two dedicated transmitter power contacts, two common ground contacts, and two transmitter signal contacts in a transmitter differential pair. The two transmitter signal contacts are both adjacent each of the two dedicated transmitter power contacts and each of the two common ground contacts. The receiver block design includes two dedicated receiver power contacts, two common ground contacts, and two receiver signal contacts in a receiver differential pair. The two receiver signal contacts are both adjacent each of the two dedicated receiver power contacts and each of the two common ground contacts.

In this manner, the routing structure, including the transmitter block design and the receiver block design, can be used as a standardized module to form the relevant portion of a package substrate for an integrated circuit, or a printed circuit board for a packaged integrated circuit, such as an ASIC, that contains the transceiver. Thus, the cost of designing and laying out a customized package substrate or printed circuit board contact pattern and associated vias and trace escape routing is avoided, because the standardized transmitter block design and receiver block design can be used instead. Thus, the costs associated with laying out a package substrate or a printed circuit board are reduced by the use of the standardized designs.

In various preferred embodiments, the transmitter block design and the receiver block design are repeated within a package substrate or printed circuit board design for as many transmitter cores and receiver cores as are included in the ASIC for which the package substrate or printed circuit board designs are configured. The transmitter block designs and the receiver block designs are preferably laid out in groups of two columns. Most preferably, a first transmitter block design in a row and a first of the two columns is a mirror image of the transmitter block design in the row and a second of the two columns. Similarly, a first receiver block design in a row and a first of the two columns is most preferably a mirror image of the receiver block design in the row and a second of the two columns. In one embodiment, at least one of a column of power contacts and a column of ground contacts are disposed between the groups of two columns of transmitter block designs and receiver block designs.

According to another aspect of the invention there is described a routing structure for a transceiver core, including a transmitter block design and a receiver block design. The transmitter block design is disposed within a transmitter design boundary, and includes only two dedicated transmitter power contacts, only two common ground contacts, and only two transmitter signal contacts in a transmitter differential pair. No other contacts are included within the transmitter design boundary. The two transmitter signal contacts are both adjacent each of the two dedicated transmitter power contacts and each of the two common ground contacts. The receiver block design is disposed within a receiver block design boundary, and includes only two dedicated receiver power contacts, only two common ground contacts, and only two receiver signal contacts in a receiver differential pair. No other contacts are included within the receiver design boundary. The two receiver signal contacts are both adjacent each of the two dedicated receiver power contacts and each of the two common ground contacts.

Preferably, the contacts of the transmitter block design and the receiver block design are each disposed in arrays of two columns and three rows. For the transmitter block design, one each of the dedicated transmitter power contacts and the common ground contacts are disposed in a first row, the two transmitter signal contacts are disposed in a second row, and one each of the dedicated transmitter power contacts and the common ground contacts are disposed in a third row. In a most preferred embodiment, one of the dedicated transmitter power contacts is disposed in a first column in a first row, one of the common ground contacts is disposed in a second column in the first row, the two transmitter signal contacts are disposed in a second row, one of the dedicated transmitter power contacts is disposed in the second column in a third row, and one of the common ground contacts is disposed in the first column in the third row.

Similarly for the receiver block design, preferably one each of the dedicated receiver power contacts and the common ground contacts are disposed in a first row, the two receiver signal contacts are disposed in a second row, and one each of the dedicated receiver power contacts and the common ground contacts are disposed in a third row. In a most preferred embodiment, one of the dedicated receiver power contacts is disposed in a first column in a first row, one of the common ground contacts is disposed in a second column in the first row, the two receiver signal contacts are disposed in a second row, one of the dedicated receiver power contacts is disposed in the second column in a third row, and one of the common ground contacts is disposed in the first column in the third row.

According to yet another aspect of the invention there is described a package substrate including the routing structure for a transceiver core as described above, and a packaged integrated circuit including the package substrate.

According to a further aspect of the invention there is described a printed circuit board including the routing structure for a transceiver core as described above.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 3 is a top plan view of an underlying layer of the platform, showing the signal lead escape pattern.

DETAILED DESCRIPTION

Figure 1:
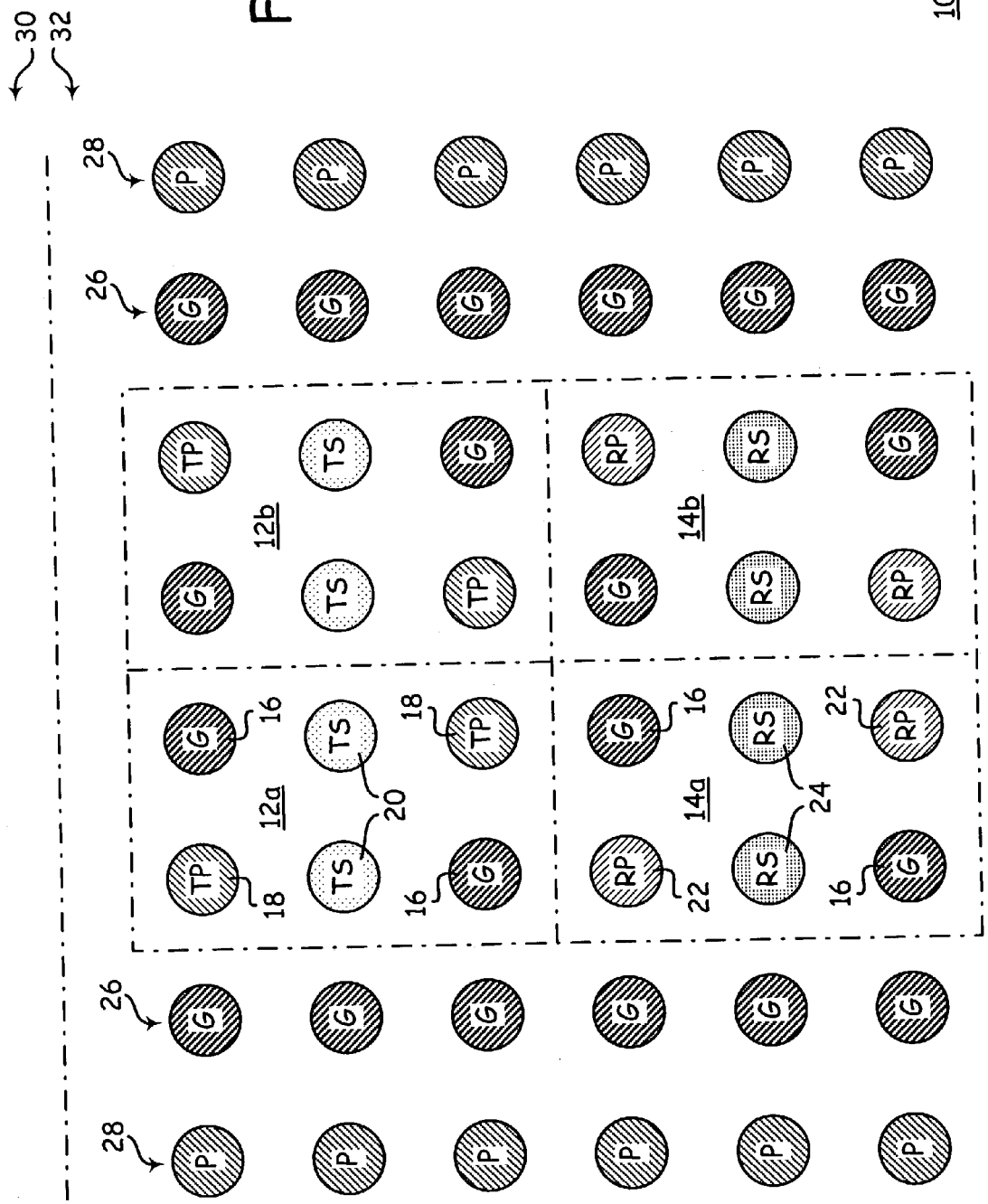
FIG. 1 is a top plan view of the contact layer of a platform according to a preferred embodiment of the present invention.

With reference now to FIG. 1, there is depicted a top plan view of the contact layer of a platform 10 according to a preferred embodiment of the present invention. The term "platform" as used herein refers to both a package substrate and a printed circuit board, and is used for convenience so as to not become unduly repetitive by referencing both the package substrate and the printed circuit board in all relevant instances. The platform 10 may be a package substrate that is adapted to receive an integrated circuit, such as an ASIC, and make electrical connections with the integrated circuit through the electrical contacts available at the top surface of the platform 10, as described with more particularity herein. However, the platform 10 may also be a printed circuit board that is adapted to receive a packaged integrated circuit, or a bare integrated circuit in some specialized embodiments, and make electrical connections with the packaged integrated circuit through the electrical contacts available at the top surface of the platform 10. Any electrical connection technology can work with the present invention, including ball grid array and chip scale package connections. Further, the invention is compatible with many different printed circuit board types and package types, including ceramic and plastic, and with either wire bond or flip chip devices.

Depicted in FIG. 1 are two transmitter blocks 12a and 12b and two receiver blocks 14a and 14b. As depicted, the blocks 12 and 14 are in the preferred configuration of a group of dual columns, with transmitter blocks 12 horizontally adjacent one another and receiver blocks 14 horizontally adjacent one another. However, the group of two columns has only two rows of blocks as depicted in FIG. 1. It is appreciated that in actual implementation, the group of two columns may have many more rows than just two, and that there would preferably be more groups of two columns than just the single group as depicted. However, depiction of a single group of two columns is sufficient to explain the various aspects of the present invention, without the burden of undue detail.

It is further appreciated that the group of two columns of blocks as depicted may in other embodiments be all transmitter blocks 12, or all receiver blocks 14, or some combination of transmitter blocks 12 and receiver blocks 14 other than that as depicted in FIG. 1. However, in the most preferred embodiment, transmitter blocks 12 are adjacent each other horizontally in any given row of the group of two columns, and receiver blocks 14 are adjacent each other horizontally in any given row of the group of two columns. Most preferably, the sets of transmitter blocks 12 or receiver blocks 14 within a given row of the set of two columns are mirror images of each other, as depicted in FIG. 1, and as further described below.

The transmitter blocks 12 and the receiver blocks 14 are delineated in FIG. 1 by phantom lines. It is appreciated that in actual implementation, no such lines physically exist on the platform 10 structure. The phantom lines are depicted in the figures for the purposes of more clearly explaining the construction of the blocks 12 and 14 according to the present invention. Similarly, the phantom line delineating portions 30 and 32 of the platform 10 also does not physically exist in actual implementation. That phantom line is also used to make the description of the embodiments more clear, as described in more detail below.

As depicted in FIG. 1, transmitter block 12a is preferably constructed with six electrically conductive contacts in an array of two columns by three rows. In the embodiment where the platform 10 is a package substrate, the electrically conductive contacts are adapted for making electrical connections between an integrated circuit connected to one portion of the package substrate and a printed circuit board connected to other portions of the package substrate. In the embodiment where the platform 10 is a printed circuit board, the electrically conductive contacts are adapted for making electrical connections between a packaged integrated circuit connected to one portion of the printed circuit board and other circuitry connected to other portions of the printed circuit board.

In the preferred embodiment, each transmitter block 12 has two of its own dedicated power contacts 18. However, transmitter blocks 12 preferably have two common ground contacts 16, which are shared with other blocks, whether they be transmitter blocks 12 or receiver blocks 14. Each transmitter block 12 also preferably includes two transmitter signal contacts 20, which are most preferably configured as a differential signal pair. Preferably, the differential signal pair of transmitter contacts 20 are disposed adjacent one another, and each of the two transmitter signal contacts 20 are also adjacent both of the dedicated transmitter power contacts 18 and both of the common ground contacts 16. However, in some instances that adjacency is provided in a diagonal direction and in other instances that adjacency is provided in a directly vertical direction.

In a most preferred embodiment, each of the two transmitter signal contacts 20 in the differential pair is vertically adjacent one of the dedicated transmitter power contacts 18 and one of the common ground contacts 16. Preferably, this configuration is enabled by placing both of the differential pair of transmitter signal contacts 20 in the second of the three rows in the contact array in the transmitter block 12, and placing one each of the dedicated transmitter power contact 18 and the common ground contact 16 in the first row above the differential pair of transmitter signal contacts 20, and one each of the dedicated transmitter power contact 18 and the common ground contact 16 in the third row below the differential pair of transmitter signal contacts 20.

Further, to enable the preferred configuration of having each of the two transmitter signal contacts 20 in the differential pair vertically adjacent to one of the dedicated transmitter power contacts 18 and to one of the common ground contacts 16, the columnar order of the dedicated transmitter power contact 18 and the common ground contact 16 in the first row is preferably reversed as to the columnar order of the dedicated transmitter power contact 18 and the common ground contact 16 in the third row, as depicted. This configuration provides a relatively high degree of signal isolation, which tends to reduce cross talk while increasing coupling between the power and ground nets.

As depicted in FIG. 1, transmitter block 12b is most preferably a mirror image of transmitter block 12a. By forming the adjacent blocks 12a and 12b as mirror images of one another in this manner, signal escape routing on other levels of the platform 10 can be made in a more uniform and standardized manner from the group of two columns of blocks, thus further reducing design costs for the platform 10. In a most preferred embodiment, groups of two columns of blocks are separated by at least one of a column of ground contacts 26 and a column of power contacts 28, or both as depicted. The ground contacts 26 can be adjacent the two columns of blocks, as depicted in FIG. 1, or the power contacts 28 can be adjacent the two columns of blocks.

The ground contacts in the columns 26 are in one embodiment common with the ground contacts in the transmitter blocks 12. In another embodiment, the power contacts in the columns 28 are isolated to at least some degree from the dedicated transmitter power contacts 18 in the transmitter blocks 12. In the preferred embodiment, some of the power contacts in the columns 28 are converted to supplement the power connections 18 and 22 of the blocks 12 and 14, while others of the power contacts 28 are isolated to support surrounding non-transceiver signals. The columns 26 and 28 of ground and power contacts tend to provide signal isolation between the groups of two columns of blocks, and further reduce cross talk between the groups of signals of the platform 10.

As depicted in FIG. 1, and similar to that as described above in regard to the transmitter blocks 12, receiver block 14a is constructed with six electrically conductive contacts in an array of two columns by three rows. In the embodiment where the platform 10 is a package substrate, the electrically conductive contacts are adapted for making electrical connections between an integrated circuit connected to one portion of the package substrate and a printed circuit board connected to other portions of the package substrate. In the embodiment where the platform 10 is a printed circuit board, the electrically conductive contacts are adapted for making electrical connections between a packaged integrated circuit connected to one portion of the printed circuit board and other circuitry connected to other portions of the printed circuit board.

In the preferred embodiment, each receiver block 14 has its own dedicated power contacts 22. However, receiver blocks 14 preferably have common ground contacts, which are shared with other blocks, whether they be transmitter blocks 12 or receiver blocks 14. Each receiver block 14 also preferably includes two receiver signal contacts 24, which are most preferably disposed as a differential signal pair. Preferably, the differential signal pair of receiver contacts 24 are disposed adjacent one another, and each of the two receiver signal contacts 24 are also adjacent both of the dedicated receiver power contacts 22 and both of the common ground contacts 16. However, in some instances that adjacency is provided in a diagonal direction and in other instances that adjacency is provided in a directly vertical direction.

In a most preferred embodiment, each of the two receiver signal contacts 24 in the differential pair is vertically adjacent one of the dedicated receiver power contacts 22 and one of the common ground contacts 16. Preferably, this configuration is enabled by placing the differential pair of receiver signal contacts 24 in the second of the three rows in the contact array in the receiver block 14, and placing one each of the dedicated receiver power contact 22 and the common ground contact 16 in the first row above the differential pair of receiver signal contacts 24, and one each of the dedicated receiver power contact 22 and the common ground contact 16 in the third row below the differential pair of receiver signal contacts 24.

Further, to enable the preferred configuration of having each of the two receiver signal contacts 24 in the differential pair vertically adjacent to one of the dedicated receiver power contacts 22 and to one of the common ground contacts 16, the columnar order of the dedicated receiver power contact 22 and the common ground contact 16 in the first row is preferably reversed as to the columnar order of the dedicated receiver power contact 22 and the common ground contact 16 in the third row, as depicted. This configuration provides a relatively high degree of signal isolation, and tends to reduce cross talk while increasing coupling between the power and ground nets.

As depicted in FIG. 1, receiver block 14b is most preferably a mirror image of receiver block 14a. By forming the adjacent blocks 14a and 14b as mirror images of one another in this manner, signal and other escape routing on other levels of the platform 10 can be made in a more uniform and standardized manner from the group of two columns of blocks, thus further reducing design costs for the platform 10. In a most preferred embodiment, groups of two columns of blocks are separated by a column of at least one of ground contacts 26 or power contacts 28, or both, as depicted. The ground contacts in the columns 26 are preferably common with the ground contacts in the receiver blocks 14. However, the power contacts in the columns 28 are preferably isolated to at least some degree from the dedicated receiver power contacts 22 in the receiver blocks 14. The columns 26 and 28 of ground and power contacts tend to provide signal isolation between the groups of two columns of blocks, and further reduce inductance and resistance of the platform 10.

Figure 2:
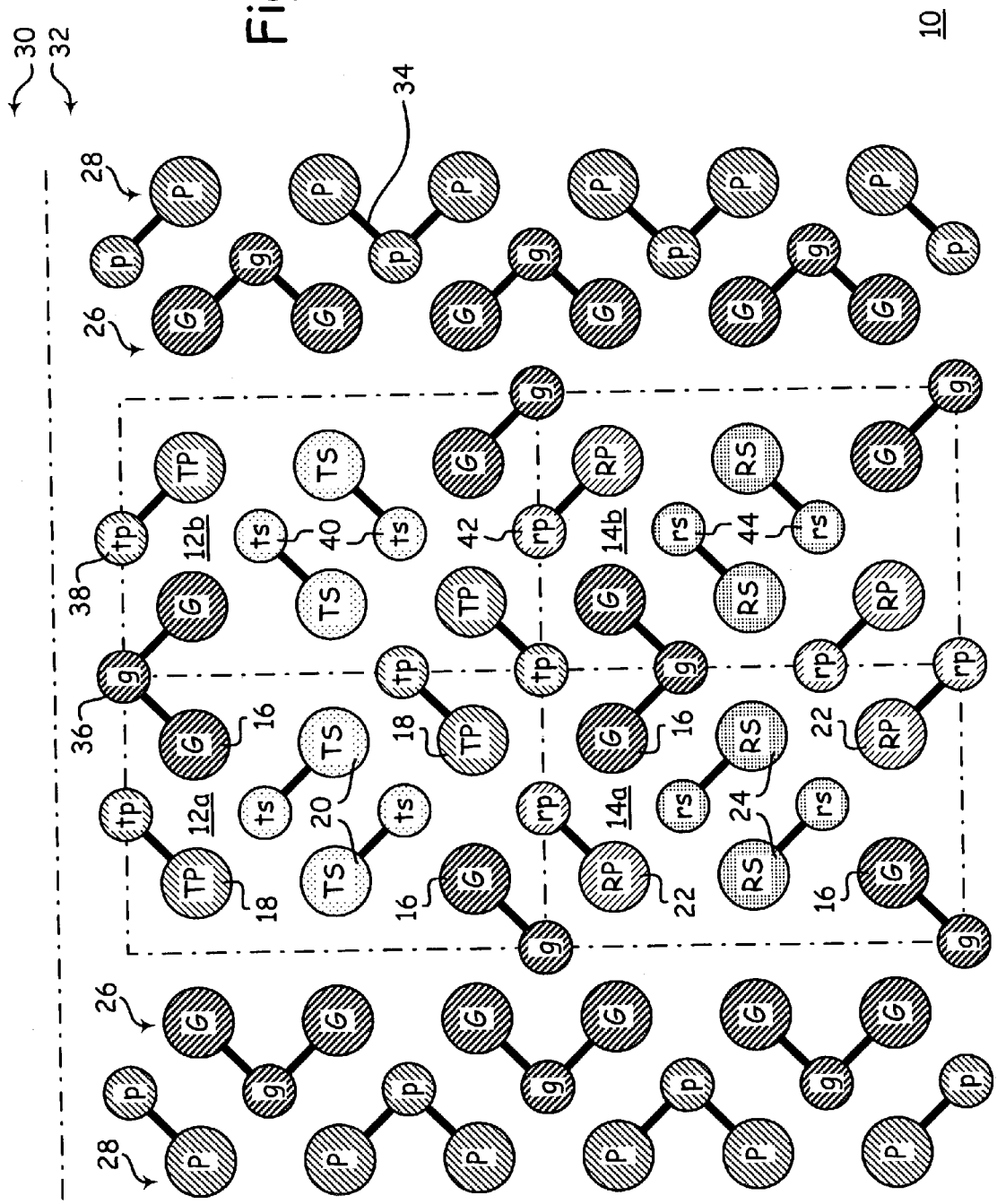
FIG. 2 is a top plan view of the platform of FIG. 1, depicting the vias and electrical connections to the contacts.

With reference now to FIG. 2, there are additionally depicted electrically conductive common ground vias 36, electrically conductive dedicated transmitter power vias 38, electrically conductive transmitter signal vias 40, electrically conductive dedicated receiver power vias 42, electrically conductive receiver signal vias 44, and electrically conductive connectors 34 between associated contacts and vias. Power vias for the columns 28 of power contacts may be common to some degree, and are most preferably shared between two power contacts in a repeating pattern, as depicted in FIG. 2. Similarly, ground vias for the columns 26 of ground contacts may be common to some degree, and are most preferably shared between two ground contacts in a repeating pattern, also as depicted in FIG. 2.

Further, the common ground contacts 16 in the blocks 12 and 14 may also share the ground vias 36 in a convenient manner, with preferably no more than about two common ground contacts 16 immediately connected to a single ground via 36. However, all other vias are preferably dedicated to the contacts which they serve. For example, a single transmitter power via 38 is preferably dedicated to a single transmitter power contact 18, a single transmitter signal via 40 is preferably dedicated to a single transmitter signal contact 20, a single receiver power via 42 is preferably dedicated to a single receiver power contact 22, and a single receiver signal via 44 is preferably dedicated to a single receiver signal contact 24.

With reference now to FIG. 3, a signal escape routing layer of the platform 10 is depicted, showing an escape routing pattern for electrically conductive signal traces 46, which are electrically connected to the transmitter signal contacts 40 and the receiver signal contacts 44. The traces 46 route out the signals from the core area 32 of the platform 10 to the peripheral area 30 of the platform 10, where the traces can be electrically connected to other electrically conductive elements for making contact with other portions of an electrical circuit that are external to the platform 10 and the packaged integrated circuit. Most preferably, the signal traces 46 are maintained with relatively close proximity between differential signal pairs, so as to maintain the quality of the signals transmitted.

In this manner, the routing structure, including the transmitter block design and the receiver block design, can be used as a standardized module to form the relevant portion of a platform for an integrated circuit, such as an ASIC, that contains the transceiver. Thus, the cost of designing and laying out a customized platform contact pattern and associated vias and trace escape routing is avoided, because the standardized transmitter block design and receiver block design can be used instead. Thus, the costs associated with laying out a platform are reduced by the use of the standardized designs.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A routing structure for a transceiver core, comprising:
a transmitter block design including two dedicated transmitter power contacts, two common ground contacts, and two transmitter signal contacts in a transmitter differential pair, where the two transmitter signal contacts are both adjacent each of the two dedicated transmitter power contacts and each of the two common ground contacts, the two transmitter signal contacts send signals to an associated circuit, the two dedicated transmitter power contacts are coupled to power for the associated circuit, and the two common ground contacts are coupled to ground for the associated circuit and other circuits, and
a receiver block design including two dedicated receiver power contacts, two common ground contacts, and two receiver signal contacts in a receiver differential pair, where the two receiver signal contacts are both adjacent each of the two dedicated receiver power contacts and each of the two common ground contacts, the two receiver signal contacts receive signals from the associated circuit, the two dedicated receiver power contacts are coupled to the power for the associated circuit, and the two common ground contacts are coupled to the ground for the associated circuit and other circuits.

2. The routing structure of claim 1, wherein the transmitter block design is repeated within a platform design for as many transmitter cores as are included in an ASIC for which the platform design is configured.

3. The routing structure of claim 1, wherein the transmitter block design is repeated within a platform design for as many transmitter cores as are included in an ASIC for which the platform design is configured, and the transmitter block designs are laid out in groups of two columns.

4. The routing structure of claim 1, wherein the transmitter block design is repeated within a platform design for as many transmitter cores as are included in an ASIC for which the platform design is configured, and the transmitter block designs are laid out in groups of two columns, where a first transmitter block design in a row and a first of the two columns is a mirror image of the transmitter block design in the row and a second of the two columns.

5. The routing structure of claim 1, wherein the transmitter block design is repeated within a platform design for as many transmitter cores as are included in an ASIC for which the platform design is configured, and the transmitter block designs are laid out in groups of two columns with a column of power contacts between the groups of two columns.

6. The routing structure of claim 1, wherein the transmitter block design is repeated within a platform design for as many transmitter cores as are included in an ASIC for which the platform design is configured, and the transmitter block designs are laid out in groups of two columns with a column of ground contacts between the groups of two columns.

7. The routing structure of claim 1, wherein the transmitter block design is repeated within a platform design for as many transmitter cores as are included in an ASIC for which the platform design is configured, and the transmitter block designs are laid out in groups of two columns with a column of power contacts and a column of ground contacts between the groups of two columns.

8. The routing structure of claim 1, wherein the receiver block design is repeated within a platform design for as many receiver cores as are included in an ASIC for which the platform design is configured.

9. The routing structure of claim 1, wherein the receiver block design is repeated within a platform design for as many receiver cores as are included in an ASIC for which the platform design is configured, and the receiver block designs are laid out in groups of two columns.

10. The routing structure of claim 1, wherein the receiver block design is repeated within a platform design for as many receiver cores as are included in an ASIC for which the platform design is configured, and the receiver block designs are laid out in groups of two columns, where a first receiver block design in a row and a first of the two columns is a mirror image of the receiver block design in the row and a second of the two columns.

11. The routing structure of claim 1, wherein the receiver block design is repeated within a platform design for as many receiver cores as are included in an ASIC for which the platform design is configured, and the receiver block designs are laid out in groups of two columns with a column of power contacts between the groups of two columns.

12. The routing structure of claim 1, wherein the receiver block design is repeated within a platform design for as many receiver cores as are included in an ASIC for which the platform design is configured, and the receiver block designs are laid out in groups of two columns with a column of ground contacts between the groups of two columns.

13. The routing structure of claim 1, wherein the receiver block design is repeated within a platform design for as many receiver cores as are included in an ASIC for which the platform design is configured, and the receiver block designs are laid out in groups of two columns with a column of power contacts and a column of ground contacts between the groups of two columns.

14. A routing structure for a transceiver core, comprising:
a transmitter block design within a transmitter design boundary, the transmitter block design including only two dedicated transmitter power contacts, only two common ground contacts, and only two transmitter signal contacts in a transmitter differential pair, and no other contacts within the transmitter design boundary, where the two transmitter signal contacts are both adjacent each of the two dedicated transmitter power contacts and each of the two common ground contacts, the two transmitter signal contacts send signals to an associated circuit, the two dedicated transmitter power contacts are coupled to power for the associated circuit, and the two common ground contacts are coupled to ground for the associated circuit and other circuits, and
a receiver block design within a receiver block design boundary, the receiver block design including only two dedicated receiver power contacts, only two common ground contacts, and only two receiver signal contacts in a receiver differential pair, and no other contacts within the receiver design boundary, where the two receiver signal contacts are both adjacent each of the two dedicated receiver power contacts and each of the two common ground contacts, the two receiver signal contacts receive signals from the associated circuit the two dedicated receiver power contacts are coupled to the power for the associated circuit, and the two common ground contacts are coupled to the ground for the associated circuit and other circuits.

15. The routing structure of claim 14, wherein the contacts of the transmitter block design are disposed in an array of two columns and three rows, with one each of the dedicated transmitter power contacts and the common ground contacts in a first row, the two transmitter signal contacts in a second row, and one each of the dedicated transmitter power contacts and the common ground contacts in a third row.

16. The routing structure of claim 14, wherein the contacts of the transmitter block design are disposed in an array of two columns and three rows, with one of the dedicated transmitter power contacts in a first column in a first row, one of the common ground contacts in a second column in the first row, the two transmitter signal contacts in a second row, one of the dedicated transmitter power contacts in the second column in a third row, and one of the common ground contacts in the first column in the third row.

17. The routing structure of claim 14, wherein the contacts of the receiver block design are disposed in an array of two columns and three rows, with one each of the dedicated receiver power contacts and the common ground contacts in a first row, the two receiver signal contacts in a second row, and one each of the dedicated receiver power contacts and the common ground contacts in a third row.

18. The routing structure of claim 14, wherein the contacts of the receiver block design are disposed in an array of two columns and three rows, with one of the dedicated receiver power contacts in a first column in a first row, one of the common ground contacts in a second column in the first row, the two receiver signal contacts in a second row, one of the dedicated receiver power contacts in the second column in a third row, and one of the common ground contacts in the first column in the third row.

19. A platform including a routing structure for a transceiver core, the routing structure comprising:
a transmitter block design including two dedicated transmitter power contacts, two common ground contacts, and two transmitter signal contacts in a transmitter differential pair, where the two transmitter signal contacts are both adjacent each of the two dedicated transmitter power contacts and each of the two common ground contacts, the two transmitter signal contacts send signals to an associated circuit, the two dedicated transmitter power contacts are coupled to power for the associated circuit, and the two common ground contacts are coupled to ground for the associated circuit and other circuits, and
a receiver block design including two dedicated receiver power contacts, two common ground contacts, and two receiver signal contacts in a receiver differential pair, where the two receiver signal contacts are both adjacent each of the two dedicated receiver power contacts and each of the two common ground contacts, the two receiver signal contacts receive signals from the associated circuit, the two dedicated receiver power contacts are coupled to the power for the associated circuit, and the two common ground contacts are coupled to the ground for the associated circuit and other circuits.

20. A packaged integrated circuit including the platform of claim 19.